United States Patent [19]

Behbahani et al.

[11] Patent Number: 5,808,499
[45] Date of Patent: Sep. 15, 1998

[54] QUADRATURE SIGNAL GENERATOR WITH SPIKE-LESS PRESCALAR CIRCUIT

[75] Inventors: Farbod Behbahani, Inglewood; Ali Fotowat-Ahmady, San Rafael; Nasrollah S. Navid; Dan Linebarger, both of Saratoga, all of Calif.

[73] Assignee: Philips Electronics North America Corporation, New York, N.Y.

[21] Appl. No.: 863,390

[22] Filed: May 27, 1997

Related U.S. Application Data

[63] Continuation of Ser. No. 539,978, Oct. 6, 1995, abandoned.

[51] Int. Cl.$^6$ .............................. G06G 7/16; H03H 11/16
[52] U.S. Cl. ......................... 327/259; 327/117; 327/239; 327/360
[58] Field of Search ..................................... 327/115, 116, 327/117, 118, 119, 356, 357, 359, 238, 239, 246, 247, 254, 255, 258, 259, 360

[56] References Cited

U.S. PATENT DOCUMENTS

| 3,624,526 | 11/1971 | Silverman | 327/254 |
| 4,754,169 | 6/1988 | Morris | 327/65 |
| 4,825,109 | 4/1989 | Reynolds | 327/258 |
| 5,444,405 | 8/1995 | Truong et al. | 327/239 |
| 5,485,110 | 1/1996 | Jones et al. | 327/99 |
| 5,515,004 | 5/1996 | Alford et al. | 330/254 |
| 5,517,134 | 5/1996 | Yaklin | 327/65 |
| 5,523,717 | 6/1996 | Kimura | 327/357 |
| 5,703,509 | 12/1997 | Hirata | 327/119 |

FOREIGN PATENT DOCUMENTS

| 0308071 | 3/1989 | European Pat. Off. | H03K 3/037 |
| 60-68714 | 4/1985 | Japan | 327/274 |

Primary Examiner—Toan Tran
Assistant Examiner—Terry L. Englund
Attorney, Agent, or Firm—Brian J. Wieghaus

[57] ABSTRACT

Self-oscillation of a prescalar circuit is avoided by including offset generators on the inputs of the prescalar circuit. This ensures that when the transistors in one differential pair in the prescalar circuit transition from ON to OFF, the other differential pair of transistors will not transition. As a result, spikes are prevented in the differential pair that does not have a transition. A quadrature signal generator constructed with such a prescalar circuit provides an accurate output despite weak or non-existent input signals.

14 Claims, 5 Drawing Sheets

QUADRATURE SIGNAL GENERATOR WITH SPIKE-LESS PRESCALAR CIRCUIT

This is a continuation of application Ser. No. 08/539,978, filed Oct. 6, 1995 and now abandoned.

BACKGROUND OF THE INVENTION

1. Field of the Invention

The present invention is directed to providing a circuit having an analog divider or radio frequency (RF) prescalar and a quadrature signal generator and, more particularly, to a non-oscillating and spike-free RF prescalar circuit and accurate quadrature signal generator suitable for use in a digital cellular telephone, or related applications.

2. Description of the Related Art

A conventional quadrature signal generator including an analog divide by 2 or prescalar circuit using emitter follower logic (EFL) is illustrated in FIG. 1. As indicated, the input signals IN and INB are each supplied to the bases of two transistors. Input signal IN is supplied to transistors Q8 and Q19 and input signal INB is supplied to transistors Q9 and Q18. When expected signal levels are received, a signal IN like that illustrated in FIG. 2A will produce the signals I and Q illustrated in FIG. 2A. Since input signal INB is simply the inverse of signal IN, signal INB is not illustrated in FIGS. 2A and 2B.

Unfortunately, the ideal situation illustrated in FIG. 2A will not always exist. The circuit illustrated in FIG. 1 has a natural or self-oscillation frequency. If this frequency is near the range of frequencies at which the circuit is operated or tested, a weak or non-existent input signal can produce an output signal at the self-oscillation frequency, instead of at the frequency of the weak input signal. This is a problem in applications where an input signal is not provided at all times that power is provided to the circuit. For example, prescalar circuits used in equipment which has power saving features to power down portions of the circuit that are not in use may result in circuits being powered up in unexpected modes. This can result in the quadrature circuit illustrated in FIG. 1 producing a false signal for a period of time before or after an input signal is received.

In addition to a totally false signal like that discussed above, a spiked signal may be produced by a circuit like that illustrated in FIG. 1. The mechanism for generation of self-oscillation and spikes is similar. When the voltages supplied to inputs IN and INB are very close to each other (e.g., under weak input signal conditions or when the input levels of IN and INB are passing through zero), the divider circuit illustrated in FIG. 1 is converted from a digital flip-flop to an analog high gain circuit with positive feedback, composed of differential pairs Q8, Q9 and Q18, Q19. It is this positive feedback that causes the unwanted spike or self-oscillation. Of course as soon as the inputs IN and INB have a few millivolts of difference, the circuit converts back to a digital circuit and behaves properly.

Typically, as illustrated in FIG. 2B, spikes occur in the output signal which is not undergoing a phase change at the time that the other output signal undergoes a phase change and the inputs are passing through a zero crossing. These spikes can affect the performance of circuits which use the output of the quadrature circuit illustrated in FIG. 1. The spikes may be detected as a change in phase of the signal, so that the frequency of the quadrature signal is detected as higher than desired. Furthermore, the noise on the input may produce spikes that are formed at irregular intervals, with the result that the false detection of phase changes in down- stream circuits will be more erratic than in the example illustrated in FIG. 2B.

When the prescalar circuit is part of an integrated circuit, prior to packaging the circuit will commonly undergo wafer testing. Conventionally wafer testing uses test equipment that cannot operate at frequencies as high as the normal operating range of a high frequency circuit, due to excessive inductance in the length of the probes used in wafer testing. As a result, wafer testing is done at lower frequencies. The spikes or self-oscillation can disrupt this essential test. A solution is then needed to eliminate the unwanted spikes and self-oscillation.

SUMMARY OF THE INVENTION

It is an object of the present invention to provide a prescalar circuit having a spike-free output.

It is also an object of the present invention to provide a prescalar circuit that will not oscillate even if the input signal level is weak or the input signal lines are an open circuit.

It is another object of the present invention to provide quadrature signal outputs that do not have spikes caused by a prescalar circuit.

It is an additional object of the present invention to provide a quadrature signal generating circuit which does not produce false output signals during normal operation or testing.

These together with other objects and advantages which will be subsequently apparent, reside in the details of construction and operation as more fully hereinafter described and claimed, reference being had to the accompanying drawings forming a part hereof, wherein like numerals refer to like parts throughout.

DESCRIPTION OF THE PREFERRED EMBODIMENTS

Figure 1:
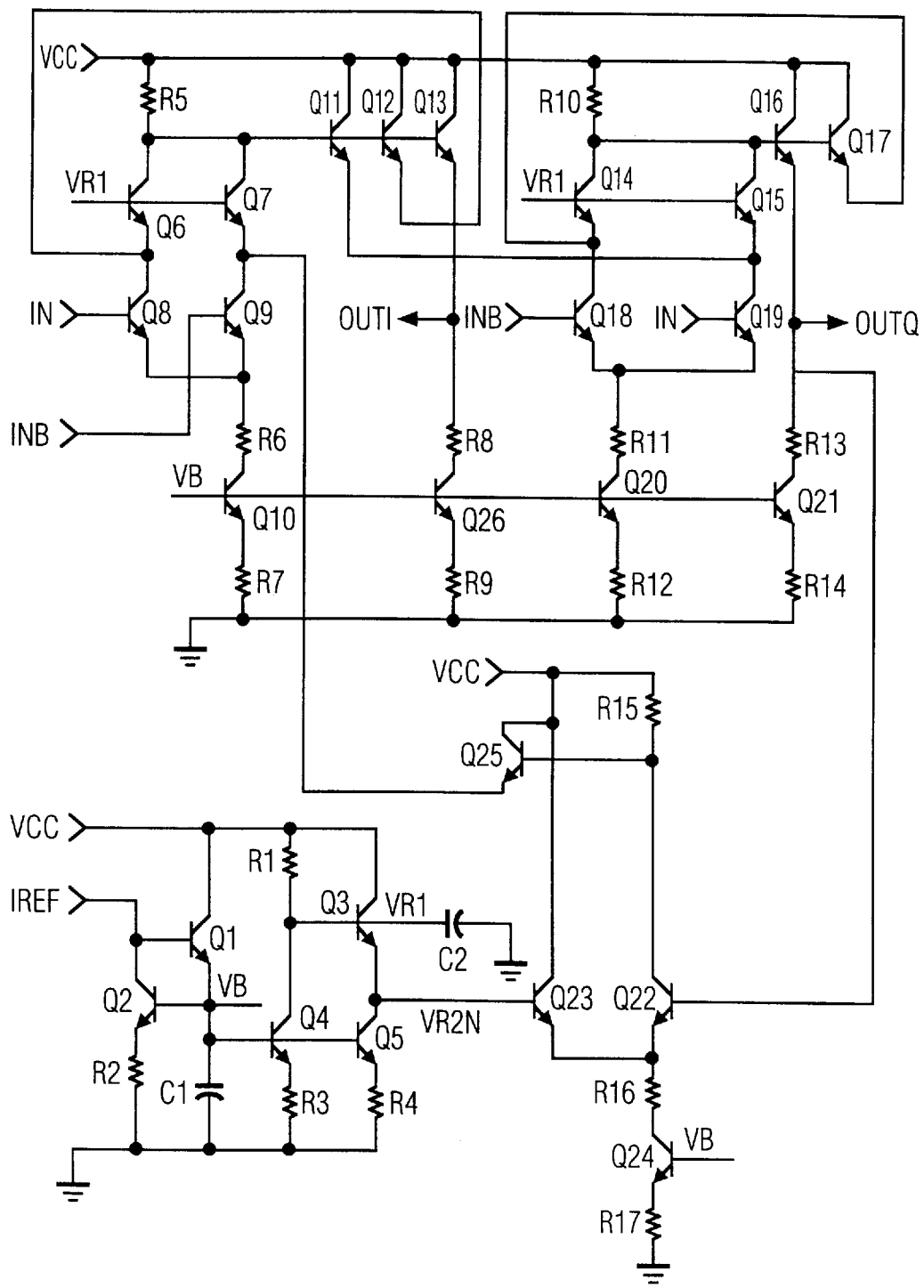
FIG. 1 is a schematic circuit diagram of a conventional quadrature signal generator with an emitter follower logic divide by 2 flip-flop.
Figure 2A:
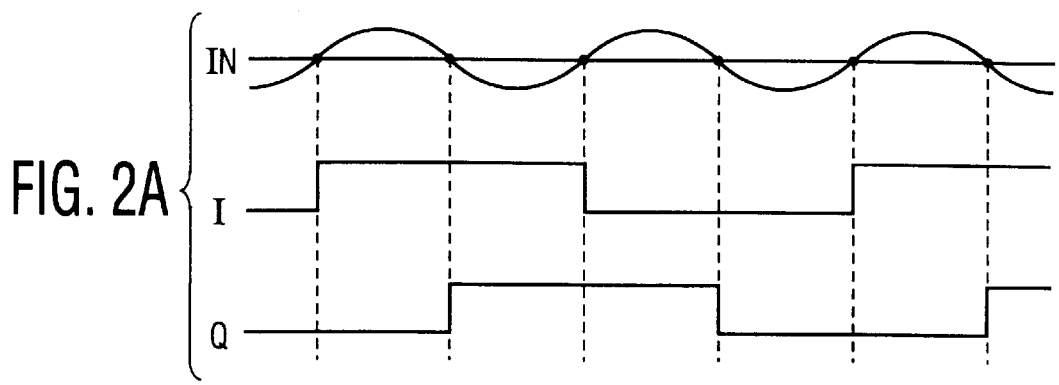
FIGS. 2A and 2B are graphs of signals in the circuit illustrated in FIG. 1.
Figure 2B:
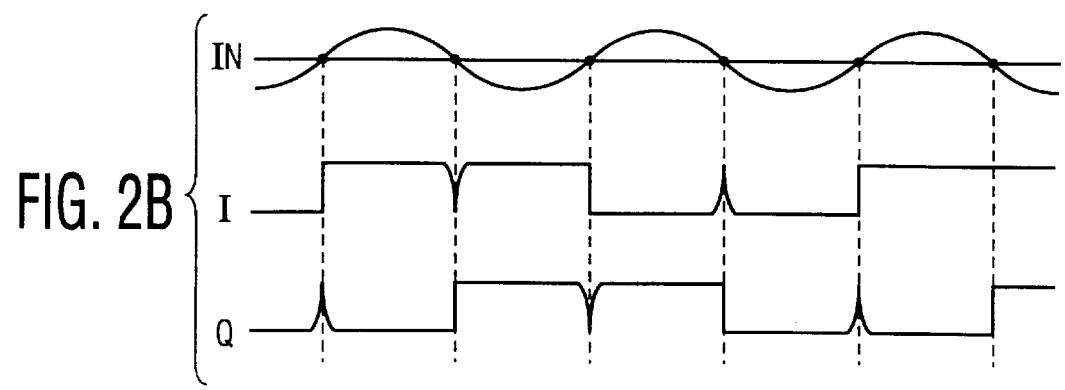
Figure 3:
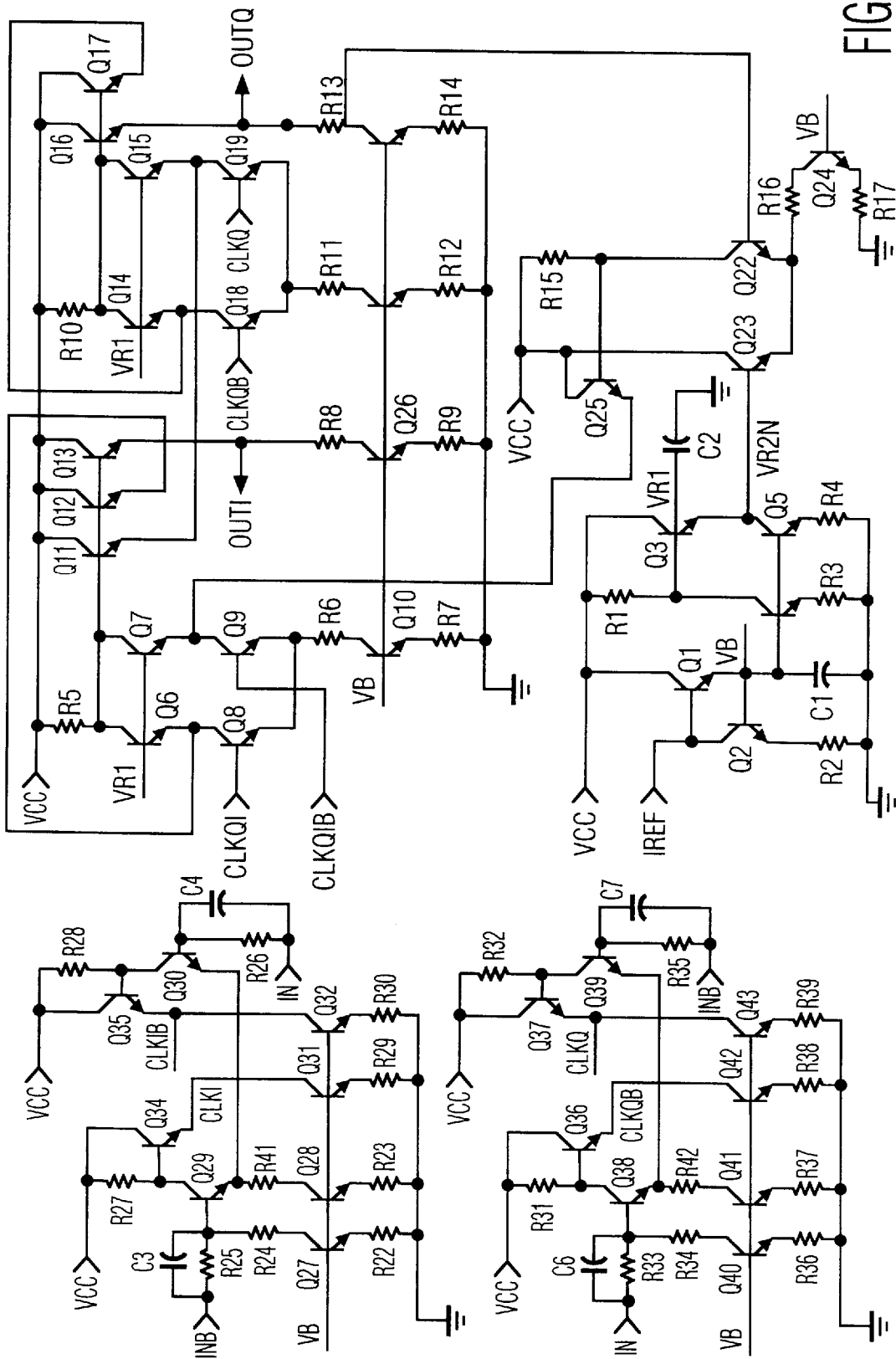
FIG. 3 is a schematic circuit diagram of an embodiment of a quadrature signal generator with an emitter follower logic divide by 2 analog divider according to the present invention.

As illustrated in FIG. 3, a prescalar circuit according to the present invention is similar to the prescalar circuit in the conventional quadrature signal generating circuit illustrated in FIG. 1. The difference between the conventional circuit illustrated in FIG. 1 and the quadrature signal generating circuit illustrated in FIG. 3 is the addition of dual offset generators at the inputs. Instead of supplying the input signals IN, INB directly to the bases of transistors Q8, Q9, Q18 and Q19, the input signals IN, INB are supplied to the dual offset generators. The upper offset generator illustrated in FIG. 3 produces signal CLKI and its inverse CLKIB which are supplied to the bases of transistors Q8 and Q9, respectively. The lower offset generator illustrated in FIG. 3 produces outputs CLKQ and its inverse CLKQB which are supplied to the bases of transistors Q19 and Q18, respectively.

In the upper offset generator which produces signals CLKI, CLKIB, transistors Q29, Q30 form a differential pair acting as an amplifier. Transistors Q34, Q35 are emitter follower buffers. The current source Q27 draws current from the resistor R25 to produce an offset voltage. In the preferred embodiment the current and resistance are selected to produce an offset voltage of 10 millivolts. The offset voltage causes transistor Q29 to turn OFF before input signal INB crosses zero volts, i.e., earlier than transistor Q39 in the lower offset generator turns OFF due to the drop in voltage of input signal INB. Due to differential coupling, transistor Q30 turns ON when transistor Q29 turns OFF. As a result, signal CLKI goes up before signal CLKQ.

The lower offset generator which produces signals CLKQ, CLKQB is constructed in a similar, but symmetrical manner compared to the upper offset generator. Transistor Q40 and resistor R33 produce a similar offset voltage which causes transistor Q38 to turn OFF before transistor Q30 in the upper offset generator, as the input signal INB crosses zero. As a result, signal CLKQ will go from low to high before signal CLKI.

Figure 4:
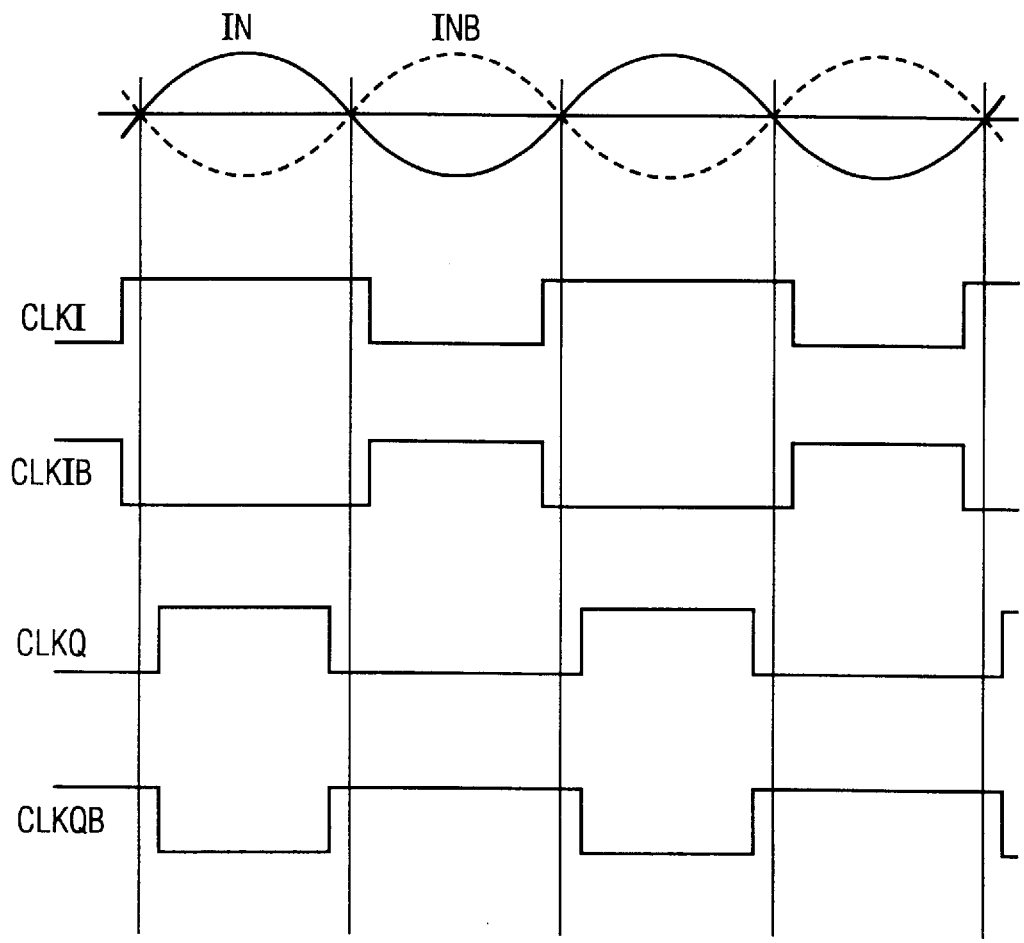
FIG. 4 is a graph of signals in the circuit illustrated in FIG. 3.

Referring to FIG. 4, it is clear that CLKI always changes its state before the positive slope zero crossing of IN and after the negative slope zero crossing of IN. On the other hand, CLKQ changes state after the positive slope zero crossing of IN and before the negative slope zero crossing of IN. In a state where INB equals IN, i.e., during zero crossings, Q30 is ON and Q29 is OFF. Similarly, Q39 will be ON and Q38 will be OFF. This is made possible by resistors R33, R25 and current sources Q27, Q40 which force the bases of Q29 and Q38 to be lower than the bases of Q30 and Q39, respectively. This in turn causes the differential pairs Q8, Q9 and Q18, Q19 to be unbalanced when IN equals INB. In the prior art circuit these differential pairs were balanced under these conditions causing the circuit to become a high gain linear amplifier with positive feedback.

Due to the addition of the offset generators in a prescalar circuit according to the present invention, transistor Q8 will be ON and transistor Q9 will be OFF during the transition of transistors Q18 and Q19 in both directions. As a result, the positive feedback condition is eliminated, thereby preventing self-oscillation and producing a spike-free output.

The present invention is not limited to the embodiment illustrated in FIG. 3. For example, FIG. 3 illustrates an EFL circuit, but the invention may be used in prescalar and quadrature circuits implemented using current mode logic (CML), etc. In addition, other methods of producing an offset may be used.

In the embodiment illustrated in FIG. 3, a fixed current flows through two of four resistors at the inputs of the offset generators to produce an offset. Two alternatives to this method of producing an offset are shown schematically in FIGS. 5A and 5B. In the alternative embodiment illustrated in FIG. 5A, the areas of the differential pair transistors are different. The area corresponding to reference character X1 is twice as large as the area corresponding to reference character X2. The difference in the areas of the two transistors which form the differential pair illustrated in FIG. 5A will cause the tail current to be split unequally (with a 2:1 ratio) when the differential input to the differential pair is zero. This will cause an offset at the two emitter follower outputs. As a result, if an identical ramp signal is supplied to the bases of the differential pair transistors illustrated in FIG. 5A, the left-hand transistor will turn ON before the right-hand transistor.

Figure 5A:
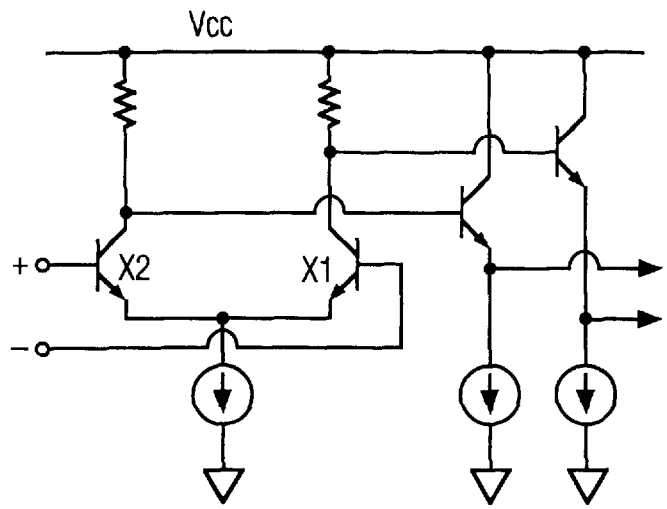
FIGS. 5A and 5B are schematic circuit diagrams of alternative methods of generating an offset voltage for a quadrature signal generator according to the present invention.
Figure 5B:
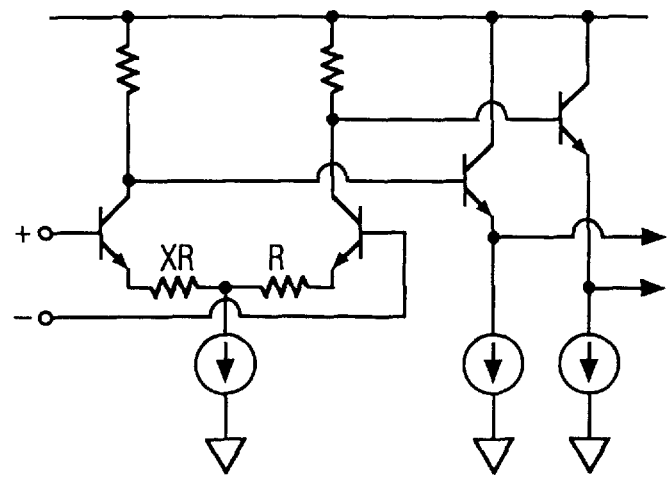

In the alternative embodiment illustrated in FIG. 5B, the same effect is achieved by resistor ratios where one emitter resistor is X times larger than the other emitter resistor. Again under a zero volt differential input, the left-hand transistor will have less current than the right-hand transistor in the differential pair illustrated in FIG. 5B. This will cause the two output emitter followers to have unequal output voltages.

The circuits shown in FIGS. 5A and 5B are functionally equivalent to the offset generator circuits added to FIG. 3. All of these circuits will produce the same offset signals which produce CLKI, CLKIB, CLKQ and CLKQB illustrated in FIG. 4.

The many features and advantages of the invention are apparent from the detailed specification and, thus, it is intended by the appended claims to cover all such features and advantages of the invention which fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A prescalar circuit, comprising:

an offset generator to receive at least one input signal, having an input frequency, and an inverted input signal and to produce at least first and second offset signals with the same frequency as the input frequency, but offset in transition phase with respect to each other, and inverted first and second offset signals, and;

a divider circuit for producing at least one output signal with an output frequency lower than the input frequency, from the first and the second offset signals and the inverted first and second offset signals;

said offset generator comprising first and second transistors having collectors coupled to said divider circuit to provide the first offset signal and the inverted first offset signal, respectively, having emitters coupled together, and having bases coupled to receive the inverted input signal and the input signal, respectively, a first offset circuit coupled to said first transistor to generate a voltage offset which serves to generate phase offset from the phase of the inverted input signal in the first offset signal, third and fourth transistors having collectors coupled to said divider circuit to provide the inverted second offset signal and the second offset signal, respectively, having emitters coupled together, and having bases coupled to receive the input signal and the inverted input signal, respectively, and a second offset circuit coupled to said third transistor to generate a voltage offset which serves to generate a phase offset from the phase of the input signal in the inverted second offset signal.

2. A prescalar circuit as recited in claim 1, wherein said offset generator produces the first offset signal with a first transition from low to high before the second offset signal transitions from low to high and a second transition from high to low after the second offset signal transitions from high to low, and wherein said divider circuit is a divide-by-two circuit producing quadrature signals as the at least one output signal.

3. A prescalar circuit as recited in claim 1,
wherein said first offset circuit comprises:
   a first resistor coupling the inverted input signal to the base of said first transistor; and
   a first current source coupled to the base of said first transistor and said first resistor at a junction therebetween, to draw a current through the first resistor producing an offset voltage at the base of said first transistor, and
wherein said second offset circuit comprises:
   a second resistor coupling the input signal to the base of said third transistor; and
   a second current source coupled to the base of said third transistor and said second resistor at a junction therebetween, to draw a current through the second resistor producing an offset voltage at the base of said third transistor.

4. A prescalar circuit as recited in claim 1,
further comprising power supply lines coupled to said first through fourth transistors and said divider circuit,
wherein said first offset circuit comprises:
first and second resistors coupling the emitters of said first and second transistors and having a junction therebetween, said first resistor having a resistance higher than said second resistor; and
a first current source coupled to the junction between said first and second resistors and to one of said power supply lines, and
wherein said second offset circuit comprises:
third and fourth resistors coupling the emitters of said third and fourth transistors and having a junction therebetween, said third resistor having a resistance higher than said fourth resistor; and
a second current source coupled to the junction between said third and fourth resistors and to the one of said power supply lines.

5. A prescalar circuit as recited in claim 1,
wherein said first transistor has a threshold voltage smaller than said second transistor; and
said third and fourth transistors are constructed so that said third transistor turns ON before said fourth transistor.

6. A quadrature signal generator, comprising:
a) an offset generator for receiving at least one input signal having an input frequency and for producing first and second offset signals and first and second inverted offset signals, said offset signals and inverted offset signals each having the same frequency as the input signal and each having a transition phase in which the signal transitions from a low state to a high state, and vice versa, said first inverted offset signal being inverted and symmetrical with respect to said first offset signal and said second inverted offset signal being inverted and symmetrical with respect to said second offset signal, the transition phases of the first and second offset signals being offset from each other, and the transition phases of the first and second inverted offset signals being offset from each other; and
b) a divider circuit for producing at least one output signal with an output frequency lower than the input frequency, from the first and the second offset signals and the first and the second inverted offset signals.

7. A quadrature signal generator as recited in claim 6,
wherein said offset generator produces the first offset signal with a first transition from low to high before the second offset signal transitions from low to high and a second transition from high to low after the second offset signal transitions from high to low, and
   wherein said divider circuit is a divide-by-two circuit producing quadrature signals as the at least one output signal.

8. A quadrature signal generator according to claim 6, wherein:
   in response to the at least one input signal being sinusoidal with a positive zero crossing and a negative zero crossing, said offset generator generating said first offset signal and said second offset signal such that one of said first and second offset signals has its transition phase before said zero crossing of said at least one input signal and the other of said first and second offset signals has its transition after said zero crossing of said at least one input signal.

9. A quadrature signal generator, comprising:
   an offset generator comprising first and second offset circuits,
   said first offset circuit including means for (i) receiving a first input signal and a second input signal which is the inverse of the first input signal and (ii) for generating, from the first and second input signals, a first offset signal and a first inverted offset signal which is inverted and symmetrical to the first offset signal,
   said second offset circuit including means for (i) receiving the first and second input signals and (ii) for generating from the first and second input signals a second offset signal and a second inverted offset signal which is inverted and symmetrical to the second offset signal,
   said offset signals and inverted offset signals each having the same frequency as the input signal and each having a transition phase in which the signal transitions from a low state to a high state, and vice versa, said first inverted offset signal being inverted and symmetrical with respect to said first offset signal and said second inverted offset signal being inverted and symmetrical with respect to said second offset signal, and the transition phases of the first and second offset signals being offset from each other and the transition phases of the first and second inverted offset signals being offset from each other; and
   a divider circuit for producing at least one output signal with an output frequency lower than the input frequency, from the first and the second offset signals and the first and the second inverted offset signals.

10. A quadrature signal generator as recited in claim 9,
wherein said offset generator produces the first offset signal with a first transition from low to high before the second offset signal transitions from low to high and a second transition from high to low after the second offset signal transitions from high to low, and
   wherein said divider circuit is a divide-by-two circuit producing quadrature signals as the at least one output signal.

11. A quadrature signal generator according to claim 8,
wherein said first and second offset circuits are symmetric to each other.

12. A quadrature signal generator according to claim 9, wherein:
   said divider circuit includes a first differential pair of input transistors, and a second differential pair of input transistors, each of said transistors having a control gate, and means for generating the quadrature output signals in response to input signals received at said control gates, said control gates of said first differential pair each receiving a respective one of said first offset signal and said first inverted offset signal, said control gates of said second differential pair each receiving a respective one of said second offset signal and said second inverted offset signal, and in response to the first input signal being sinusoidal with a positive zero crossing and a negative zero crossing, said offset generator generating said first offset signal and said second offset signal such that one of said first and second offset signals has its transition phase before said zero crossing of said first input signal and the other of said first and second offset signals has its transition after said zero crossing of said first input signal, whereby said first differential pair and said second differential pair are unbalanced during the zero crossing of said first input signal and the second input signal.

13. A quadrature signal generator, comprising:

a) input means for receiving (i) a first sinusoidal input signal having a positive zero crossing and a negative zero crossing and (ii) a second input signal which is the inverse of the first input signal;

b) a divider circuit for generating a quadrature signal in response to said first and second input signals, said divider circuit including a first differential pair of input transistors, and a second differential pair of input transistors, each of said transistors having a control gate, each of said differential pairs, being balanced when signals received at the control gates of each pair are equal; and c) an offset generator circuit, including said input means, for providing a first pair of offset signals including a first offset signal and an inverted first offset signal each to a respective control gate of said first differential pair and a second pair of offset signals including a second offset signal and an inverted second offset signal each to a respective control gate of said second differential pair, said offset signals each having a transition phase in which the signals transition from a low state to a high state and vice versa, said offset generator generating said first offset signals and said second offset signals such that one of said first and second pairs of offset signals has its transition phase before said zero crossing of said first input signal and the other of said first and second-pairs of offset signals has its transition after said zero crossing of said first input signal, whereby said first differential pair and said second differential pair are unbalanced during the zero crossing of said first input signal and the second input signal.

14. A quadrature signal generator according to claim 13, wherein said first and second pair of offset signals each have the same frequency as the first and second input signals.

\* \* \* \* \*